United States Patent [19]
Ohmagari et al.

[11] Patent Number: 5,410,747
[45] Date of Patent: Apr. 25, 1995

[54] DUAL CONVERSION TRANSMITTER

[75] Inventors: Shinichi Ohmagari; Osamu Yamamoto, both of Tokyo, Japan

[73] Assignee: NEC Corporation, Tokyo, Japan

[21] Appl. No.: 92,667

[22] Filed: Jul. 14, 1993

Related U.S. Application Data

[63] Continuation of Ser. No. 738,853, Jul. 31, 1991, abandoned.

[30] Foreign Application Priority Data

Jul. 31, 1990 [JP] Japan .................. 2-201129

[51] Int. Cl.⁶ ............................ H04B 1/04
[52] U.S. Cl. .................. 455/118; 455/114; 455/119
[58] Field of Search ............ 455/118, 123, 189.1, 455/314, 110, 102, 112–114, 119, 87, 266, 314, 340

[56] References Cited

U.S. PATENT DOCUMENTS

| | | | |
|---|---|---|---|
| 4,025,855 | 5/1977 | Atkinson | 455/113 |
| 4,262,361 | 4/1982 | Haver | 455/118 |
| 4,322,995 | 4/1982 | Tavel | 333/174 |
| 4,458,207 | 7/1984 | Favreau et al. | 455/266 |
| 4,581,643 | 4/1986 | Carlson | 455/315 |
| 5,027,430 | 6/1991 | Yamauchi et al. | 455/190 |

FOREIGN PATENT DOCUMENTS 62-43609  9/1987  Japan .

*Primary Examiner*—Reinhard J. Eisenzopf
*Assistant Examiner*—Chi H. Pham
*Attorney, Agent, or Firm*—Ostrolenk, Faber, Gerb & Soffen

[57] ABSTRACT

A transmitter using a dual conversion system which effects frequency conversion twice has a local oscillator (113) for generating a first local oscillation signal, a multiplier (118) for multiplying the frequency of the first local oscillation signal to produce a second local oscillation signal, a first mixer (115) for mixing the first local oscillation signal and first IF signal to produce a second IF signal, and a second mixer (120) for mixing the second local oscillation signal and second IF signal to produce a signal to be transmitted. A voltage controlled filter (116) whose center frequency varies with the frequency of the first local oscillation signal is connected to the output of the first mixer (115).

13 Claims, 2 Drawing Sheets

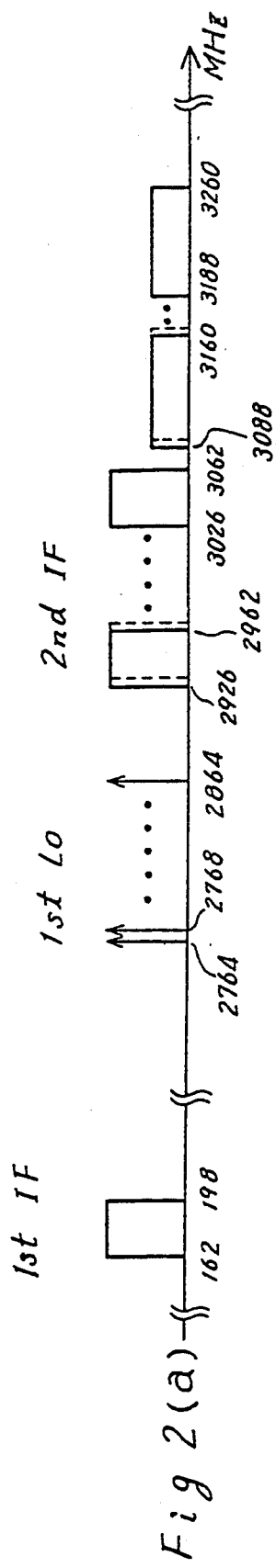
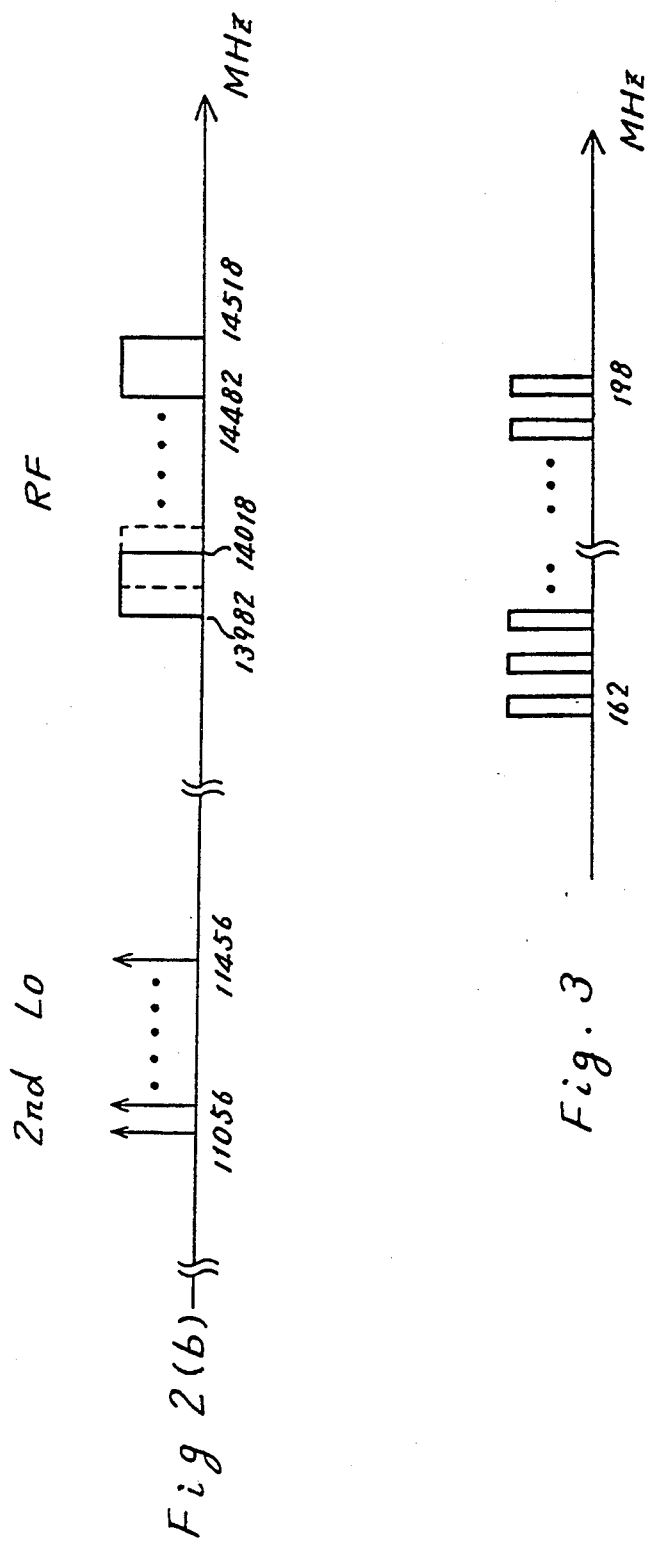
Fig 2(a)
Fig 2(b)
Fig. 3

DUAL CONVERSION TRANSMITTER

This is a continuation of application Ser. No. 07/738,853, filed on Jul. 31, 1991 now abandoned.

BACKGROUND OF THE INVENTION

The present invention relates to a transmitter and, more particularly, to a transmitter of the type using a dual conversion system which subjects a modulated signal to frequency conversion twice to produce a high frequency signal to be transmitted.

A transmitter using a dual conversion system is disclosed in, for example, Japanese Patent Publication No. 43609/1987 (JP-B2-62-43609). The transmitter disclosed in this Patent Publication has a single local oscillator. Specifically, one of two frequency converters is supplied with a local oscillation signal from the single local oscillator while the other is supplied with a multiplied local oscillation signal. Such a single local oscillator scheme is successful in reducing the circuit scale of a transmitter.

In a very small aperture terminal (VSAT) system, a frequency band to be used is allocated beforehand. The allocated frequency band is subdivided into a plurality of frequency bands, and each of such frequency bands is assigned to a respective one of VSAT station. A hub station sometimes control the frequency band assigned to each VSAT station, depending on the traffic. Therefore, each VSAT station has a variable frequency local oscillator so that the transmission signal frequency may be varied beforehand.

The conventional transmitter using a dual conversion system and having a single local oscillator as stated earlier is applicable to the VSAT system. However, at a VSAT station, a modulated signal from an indoor unit (IDU) which includes a modulating section is inputted to an outdoor unit (ODU) by a cable. Since the cable loss increases with the increase in the frequency of the modulated signal which is propagated through the cable, the frequency of the modulated signal should preferably be low. In this condition, the leakage component of the local oscillation signal has a frequency close to the frequency of a frequency-converted intermediate frequency (IF) signal, as will be described later in detail. In addition, the frequency of the frequency-converted IF signal is close to the frequencies of spurious components. Further, use is made of a band pass filter having a broad pass band, so that a plurality of frequency bands may be used. It follows that the band pass filter connected to the output of the frequency converter and having a fixed band width has to have a sharp cut-off characteristic at the outside of the band. However, a band pass filter with a sharp cut-off characteristic is expensive and, moreover, difficult to produce.

SUMMARY OF THE INVENTION

It is therefore an object of the present invention to provide an inexpensive transmitter.

It is another object of the present invention to provide a transmitter implemented with a filter which does not have a sharp cut-off characteristic at the outside of the band.

According to the invention, a transmitter has a voltage controlled filter connected to the output of a mixer which mixes a modulated signal or first IF signal and a local oscillation signal to produce a second IF signal. The center frequency of the voltage controlled filter is varied in matching relation to the frequency of the local oscillation signal. The transmitter removes unnecessary components close to the frequency of the second IF signal by means of a variable frequency band pass filter which does not need to have a sharp cut-off characteristic at the outside of the band.

BRIEF DESCRIPTION OF THE DRAWINGS

The above and other objects, features and advantages of the present invention will become more apparent from the following detailed description taken with the accompanying drawings in which:

FIGS. 2A & 2B show the frequency arrangement of input and output signals of various circuits shown in FIG. 1; and FIG. 3 shows the frequency arrangement of a plurality of first IF signals.

DETAILED DESCRIPTION OF THE PREFERRED EMBODIMENT

Figure 1:
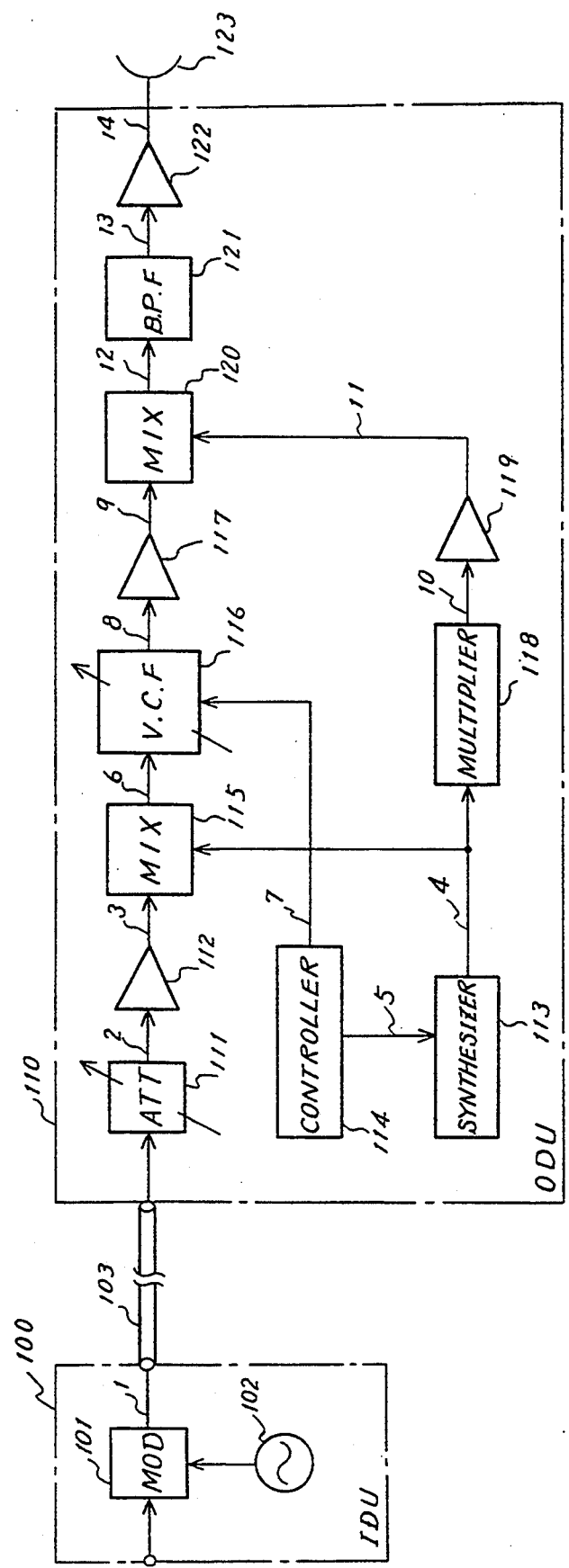
FIG. 1 is a block diagram schematically showing a transmitter embodying the present invention.

Referring to FIG. 1 of the drawings, a transmitter embodying the present invention is shown and generally made up of an IDU 100, a cable 103, an ODU 110, and an antenna 123. The operation of the embodiment will be described with reference also made to FIG. 2.

In the IDU 100, a modulator 101 modulates a carrier wave from a local oscillator 102 in response to a data signal by phase modulation or a similar modulation scheme. The resultant modulated signal or first intermediate frequency (IF) signal 1 has a bandwidth of several hundred kHz. The center frequencies of this signal 1 are arranged in a relatively low frequency band of 180±18 MHz and separated by intervals greater than their band width, so that the cable loss of the cable 103 may be reduced. Specifically, as shown in FIG. 3, the lowest center frequency is 162 MHz while the highest center frequency is 198 MHz. The individual IF signals each having a bandwidth of several hundred kHz are arranged separated by interval greater than their bandwidth. In FIG. 2, the frequency arrangement of the IF signal 1 is represented by a single square, and only the minimum and maximum center frequencies are shown with the band widths omitted. The following description will also concentrate on the center frequencies.

The cable 103 feeds the first IF signal whose center frequency is $f_1$ from the IDU 100 to a variable attenuator 111 included in the ODU 110. The variable attenuator 111 controls the amplitude of the first IF signal 1 to a predetermined value to produce an amplitude-controlled first IF signal 2. A first amplifier 112 receives the amplitude-controlled first IF signal 2 and amplifies it to output an amplified first IF signal 3. A variable frequency local oscillator or synthesizer 113 generates first local oscillation (Lo) signals 4. The first Lo signals 4 are arranged in a range of 2764 to 2864 MHz at an interval of 4 MHz, and one frequency ($f_{LO}$) is selected by a first control signal 5 fed to the synthesizer 113 from a controller 114. A first mixer 115 mixes the amplified first IF signal 3 and first Lo signal 4 to produce a second IF signal 6 whose center frequency is $f_1 + f_{LO}$. The second IF signal 6 lies in the range of 2926 to 3062 MHz. The first mixer 6 outputs the leakage component $f_{LO}$ of the first Lo signal and spurious components together with the second IF signal 6. Regarding spurious components close to the frequency band of the second IF signal 6, they may include the mixture of a signal having double the frequency of the first IF signal and the first Lo signal, i.e., $f_{LO}+2f_1$ (3088 to 3260 MHz). A voltage controlled filter (V.C.F) 116 removes such leakage components and spurious components. The V.C.F 116 has the center frequency of its pass band controlled by a second control signal 7 fed from the controller 114. Assuming that the frequency of the first Lo signal 4 is controlled to 2764 MHz by the first control signal 5 from the controller 114, then the center frequency of the second IF signal 6 is in the range of (2944−18) to (2944+18) MHz. At this instant, the pass band of the V.C.F 116 is also controlled to be 2944±18 MHz by the second control signal 7 from the controller 114. Since the pass band of the V.C.F 116 is sufficiently remote from the center frequency (2764 MHz) of the leakage components of the first Lo signals 4 and the spurious components (3088 to 3160 MHz), the cut-off characteristic of the V.C.F 116 for the outside of the band does not have to be sharp.

As another example, assuming that the frequency of the first Lo signal 4 is controlled to be 2768 MHz by the first control signal 5, then the center frequency of the second IF signal 6 is in the range of (2948−18) to (2948+18) MHz. At this instant, the pass band of the V.C.F 116 is controlled to 2948±18 MHz.

As a third example, assuming that the frequency of the first Lo signal 4 is controlled to be 2864 MHz by the first control signal 5, then the center frequency of the second IF signal 6 is in the range of (3044−18) to (3044+18) MHz. Such a pass band (3026 to 3062 MHz) is sufficiently remote from the leakage components (2864 MHz) of the first Lo signals and the spurious components (3188 to 3260 MHz). The spurious components occur in a range of 3124±36, 3128±36, and 3224±36 MHz under the above conditions. In this manner, the pass band of the V.C.F 116 is variable in matching relation to the frequency of the first Lo signal 4.

It has been customary to connect a band pass filter (B.P.F.) having a fixed pass band to the output of the first mixer 6. In such a configuration, the pass band of the B.P.F. is fixed at 2926 to 3062 MHz with no regard to the frequency of the Lo signal. Hence, the spurious components (3088 to 3160 MHz) appearing when the frequency of the Lo signal is 2764 MHz, and the leakage component appearing when it is 2864 MHz, are close to the pass band of the B.P.F. Such spurious components or leak components cannot be removed unless the B.P.F. has a sharp cut-off characteristic for the outside of the band. A filter with a sharp cut-off characteristic is expensive and difficult to produce.

In light of the above, the illustrative embodiment changes the pass band of the V.C.F. 116, whose pass band width is identical with the frequency band width of the modulated signal or first IF signal, in matching relation to the frequency of the first Lo signal. This is successful in removing the spurious components and leakage components even if the filter does not have a sharp cut-off characteristic.

A second amplifier 117 receives the second IF signal 8 from the V.C.F. 116 and from which unnecessary components have been removed, and amplifies it to output an amplified second IF signal 9. A multiplier 118 multiplies the frequency of the input signal by N (integer greater than 1). Generally, the construction of a multiplier is simpler when N is an even number than when it is an odd number, as well known in the art. The transmission frequency band is the 14 GHz band, as will be described. Assuming N=2, then the second IF signal lies in a high frequency band of 6 GHz and, therefore, the V.C.F. or the amplifier becomes expensive. On the other hand, assuming N=6, then the band width necessary for a plurality of second IF signals should be broadened, resulting in the increase in the band width of the V.C.F. Preferably, therefore, the integer N should be 4. The multiplier 118 multiplies the first Lo signal 4 by 4 to produce a second Lo signal 10 whose frequency ranges from 11056 to 11456 MHz. A third amplifier 119 amplifies the second Lo signal 10 to output an amplified second Lo signal 11. A second mixer 120 mixes the amplified second IF signal 9 and amplified second Lo signal 119, thereby producing a high frequency transmission signal (RF signal) 12. The frequency of the RF signal 12 is 13982 to 14518 MHz. Assuming that the second Lo signal 10 is 11056, 11072 or 11456 MHz, then the RF signal 12 is 14000±18, 14020±18, or 14500±18 MHz. A band pass filter (B.P.F.) 121 has a pass band of 13982 to 14518 MHz for thereby removing unnecessary components other than the RF signal 12. Since the unnecessary components, i.e., the leakage components of the second Lo signals and the spurious components, are remote from the frequency band of the RF signal, it is not necessary to use a V.C.F. A fourth amplifier 122 amplifies the RF signal 13 from the B.P.F. 121 to output an amplified RF signal 14. The amplified RF signal 14 is radiated from the antenna 123.

In summary, in accordance with the present invention, a voltage controlled filter having a variable center frequency is connected to the output of a mixer which mixes a modulated signal or first IF signal and a local oscillation signal from a synthesizer to thereby produce a second IF signal. The center frequency of the voltage controlled filter is varied in matching relation to the frequency of the local oscillation signal, whereby spurious components and leakage components close to the frequency of the second IF signal are removed. Further, the present invention implements an inexpensive transmitter since the voltage controlled filter does not have to have a sharp cut-off characteristic at the outside of the band.

What is claimed is:

1. A transmitter using a dual conversion system which subjects a modulated signal to frequency conversion twice to produce a high frequency signal to be transmitted, comprising:

variable frequency local oscillation means for generating a plurality of first local oscillation signals each having a particular frequency $f_{LO}$;

first mixing means for mixing any of said first local oscillation signals and a first intermediate frequency (IF) signal having a frequency $f_1$ which is said modulated signal to produce a second IF signal having a frequency $(f_{LO}+f_1)$;

bandpass filter means having a variable center frequency for receiving and passing said second IF signal while removing an unnecessary component having a frequency $(f_{LO}+2f_1)$ to thereby produce a filtered second IF signal without the unnecessary component;

multiplying means for multiplying the frequency of said first local oscillation signal by an integer N to output a second local oscillation signal having a frequency $Nf_{LO}$;

second mixing means for mixing said filtered second IF signal and said second local oscillation signal to produce said high frequency signal, said high frequency signal having a frequency $(f_1+(N+1)f_{LO})$; and control means for controlling the frequency of said first local oscillation signal and the center frequency of said bandpass filter means, so that the center frequency of said bandpass filter means and that of said second IF signal are substantially the same.

2. A transmitter as claimed in claim 1, wherein said band pass filter means comprises a voltage controlled filter.

3. A transmitter as claimed in claim 1, wherein said multiplying means multiplies said first local oscillation signal by 4.

4. A transmitter as claimed in claim 1, wherein the passband width of the band pass filter means is substantially the same as the band width of the first IF signal.

5. A transmitter as claimed in claim 1, wherein the center frequency of said first IF signal, the frequency band of said high frequency signal, the frequency band of said first local oscillation signal, and the frequency band of said unnecessary component are in the range of $(180-18)$ to $(180+18)$ MHz, 13982 to 14518 MHz, 2764 to 2864 MHz, and 3088 to 3260 MHz, respectively.

6. A transmitter as claimed in claim 5, wherein said indoor unit and said outdoor unit are connected by a cable.

7. A transmitter as claimed in claim 5, wherein said band pass filter means comprises a voltage controlled filter.

8. A transmitter using a dual conversion system which subjects a modulated signal to frequency modulation twice to produce a signal to be transmitted, comprising an indoor unit and an outdoor unit;

said indoor unit comprising:
modulating means for modulating a carrier wave in response to a data signal to produce a first IF signal which is said modulated signal;

said outdoor unit comprising:
variable frequency local oscillation means for generating a plurality of first local oscillation signals each having a particular frequency;
first mixing means for mixing a first local oscillation signal selected from said plurality of local oscillation signals and said first IF signal to produce a second IF signal;
band pass filter means having a center frequency, and control means for controlling said center frequency on the basis of the frequency of said first local oscillation signal, said band pass filter means receiving and passing said second IF signal to produce a filtered second IF signal without unnecessary components, said control means controlling the frequencies of the first local oscillation signal and the band pass filter so that the center frequency of said band pass filter and that of said second IF signal are substantially the same;
multiplying means for multiplying the frequency of said first local oscillation signal to output a second local oscillation signal; and
second mixing means for mixing said filtered second IF signal and said second local oscillation signal to produce said high frequency signal;
wherein said multiplying means multiplies said first local oscillation signal by 4.

9. A transmitter using a dual conversion system which subjects a modulated signal to frequency modulation twice to produce a signal to be transmitted, comprising an indoor unit and an outdoor unit;

said indoor unit comprising:
modulating means for modulating a carrier wave in response to a data signal to produce a first IF signal having a frequency $f_1$ which is said modulated signal;

said outdoor unit comprising;
variable frequency local oscillation means for generating a plurality of first local oscillation signals each having a particular frequency $f_{LO}$;
first mixing means for mixing a first local oscillation signal selected from said plurality of local oscillation signals and said first IF signal to produce a second IF signal having a frequency $(f_{LO}+f_1)$;
bandpass filter means having a center frequency, and control means for controlling said center frequency on the basis of the frequency of said first local oscillation signal, said bandpass filter means receiving and passing said second IF signal to produce a filtered second IF signal without an unnecessary component having a frequency $(f_{LO}+2f_1)$, said control means controlling the frequencies of the first local oscillation signal and the bandpass filter so that the center frequency of said bandpass filter and that of said second IF signal are substantially the same;
multiplying means for multiplying the frequency of said first local oscillation signal by an integer N to output a second local oscillation signal having a frequency $(Nf_{LO})$; and
second mixing means for mixing said filtered second IF signal and said second local oscillation signal to produce said high frequency signal having a frequency $(f_1+(N+1)f_{LO})$.

10. A transmitter as claimed in claim 9, wherein the passband width of the band pass filter means is substantially the same as the band width of the first IF signal.

11. A transmitter using a dual conversion system which subjects a modulated first intermediate frequency (IF) signal having a frequency $f_1$ to frequency conversion twice to produce a high frequency signal to be transmitted, comprising:

variable frequency local oscillation means for generating a first local oscillation signal having a particular variable frequency $f_{LO}$, and multiplying means responsive to said first local oscillation signal for outputting a second local oscillation signal having a frequency $Nf_{LO}$ (where N is an integer), whose frequency is a multiple of that of said first oscillation signal;
first mixing means for mixing said first local oscillation signal and said first IF signal to produce a second IF signal having a frequency $(f_{LO}+f_1)$;
bandpass filter means having a variable center frequency for receiving and passing said second IF signal while removing an undesired component having a frequency $(f_{LO}+2f_1)$, to thereby produce a filtered second IF signal without undesired component;
second mixing means for mixing said filtered second IF signal and said second local oscillation signal to produce said high frequency signal having a frequency $(f_1+(N+1)f_{LO})$; and
control means for controlling the frequency of said first local oscillation signal and the center frequency of said bandpass filter means, so that the second IF signal and said bandpass filter means have substantially the same center frequency.

12. A transmitter as claimed in claim 11, wherein the pass band width of the bandpass filter means is substantially the same as the band width of the first IF signal.

13. A transmitter as claimed in claim 11, wherein the foregoing means are comprised in an outdoor unit, and further comprising an indoor unit which comprises modulating means for modulating a carrier wave in response to a data signal to produce said first IF signal, and cable means for carrying said first IF signal from said indoor unit to said outdoor unit.

* * * * *